(12) United States Patent
Kao

(10) Patent No.: US 6,232,162 B1
(45) Date of Patent: May 15, 2001

(54) METHOD OF COMPLEMENTARY METAL-OXIDE SEMICONDUCTOR

(75) Inventor: Ming-Cheng Kao, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/236,932

(22) Filed: Jan. 25, 1999

(30) Foreign Application Priority Data

Oct. 19, 1998 (TW) ................................................ 87117233

(51) Int. Cl.⁷ .................................................. H01L 21/8238
(52) U.S. Cl. ............................ 438/199; 438/202; 438/268
(58) Field of Search ..................................... 438/199, 200, 438/213, 216, 223, 224, 227, 228, 229, 230, 231, 232, 286, 268, 273, 334

(56) References Cited

U.S. PATENT DOCUMENTS 5,849,615 * 12/1998 Ahmad et al. ....................... 438/231

* cited by examiner

Primary Examiner—David Nelms
Assistant Examiner—David Vu
(74) Attorney, Agent, or Firm—Jiawei Huang; J.C. Patents

(57) ABSTRACT

A method of fabricating a complementary metal-oxide semiconductor. A semiconductor substrate having a first conductive type region and a second conductive type region is provided. A conductive layer is formed on the substrate. A patterned insulating layer is formed on the conductive layer. A first photoresist layer is formed over the substrate to cover the first region. A portion of the conductive layer on the second region is removed until the substrate is exposed using the insulating layer as a hard mask. A first doping process is performed to the substrate using the first photoresist layer as a mask. The first photoresist layer is removed. A second photoresist layer is formed to cover the second region. A portion of the conductive layer in the first region is removed until the substrate is exposed using the insulating layer as a hard mask. A second doping process is performed on the substrate using the second photoresist layer as a mask. The second photoresist layer is removed.

14 Claims, 5 Drawing Sheets

METHOD OF COMPLEMENTARY METAL-OXIDE SEMICONDUCTOR

CROSS-REFERENCE TO RELATED APPLICATION

This application claims the priority benefit of Taiwan application serial no. 87117233, filed Oct. 19, 1998, the full disclosure of which is incorporated herein by reference.

BACKGROUND OF THE INVENTION

1. Field of Invention

The present invention relates to a method of fabricating semiconductor devices. More particularly, the present invention relates to a method of fabricating a complementary metal-oxide semiconductor (CMOS).

2. Description of Related Art

A complementary metal-oxide semiconductor (CMOS) is composed of an N-type MOS and a P-type MOS. Less electrical energy is needed in operating the CMOS transistor, therefore, the CMOS is mostly used in very large scale integration (VLSI), and also in ultra large scale integration (ULSI).

FIG. 1A through FIG. 1E are schematic, cross-sectional views showing a conventional method of fabricating a complementary metal-oxide semiconductor. In FIGS. 1A to 1D, the part of the wafer indicated by the reference numeral 100 shows the area where an NMOS transistor will be formed, while the other part indicated by the reference numeral 102 shows the area where a PMOS transistor will be formed. As shown in FIG. 1A, a P-type semiconductor substrate 104 is provided, wherein an N-well region 106 is formed. A plurality of field oxide layers 108 are formed on the substrate 104 by local oxidation to define a plurality of active regions of NMOS 100 and PMOS 102. A gate oxide layer 110 is formed on the substrate 104 by dry oxidation. A polysilicon layer 112 is formed over the substrate 104 by low-pressure chemical vapor deposition (LPCVD). A photolithography process is performed. A patterned photoresist layer 116a is formed over the substrate 104.

As shown in FIG. 1B, using the photoresist layer 116a as a mask, the polysilicon layer 112 and the oxide layer 110 are subsequently etched to simultaneously form gates 114a on the area 100 and gates 114b on the area 102.

As shown in FIG. 1C, ion implantation is performed. At first, a photoresist layer 116b is formed over the substrate 104 to cover only the area 102. Using the photoresist layer 116b as a mask, an ion implantation is performed on the substrate 104 to form lightly doped regions 118 beside the gates 114a in the area 100. Then, the photoresist layer 116b is removed.

As shown in FIG. 1D, another photoresist layer 116c is then formed over the substrate 104 to cover only the area 100. Using the photoresist layer 116c as a mask, another ion implantation is performed on the substrate 104 to form lightly doped regions 120 beside the gates 114b in the area 102. Then, the photoresist layer 116c is removed.

As shown in FIG. 1E, spacers 122 are simultaneously formed on sidewalls of the gates 114a in the area 100 and the gates 114b in the area 102. Using the spacers 122 as masks, a heavy ion implantation is respectively performed on the substrate 104 to form heavily doped regions in he area 100 and in the area 102. Consequently, source/drain regions 124 having a lightly doped drain (LDD) structure are respectively formed beside the gates 114a and the gates 114b. At this step, a CMOS transistor having an NMOS and a PMOS is formed.

Before the gate is formed on the substrate, in order to adjust the difference between the NMOS's threshold voltages and the PMOS's threshold voltages, an ion implantation is performed. One method is to implant phosphorous ions into the polysilicon layer of the gate to adjust the threshold voltages of the NMOS and the PMOS. But this step causes variance in concentration distribution of dopants in the polysilicon layer of NMOS and PMOS. In other words, the dopant concentrations in the polysilicon layer of NMOS and PMOS are different. While the polysilicon layer with different dopant concentrations is etched to simultaneously form gates of NMOS and PMOS, etching rates of NMOS and PMOS are different so that line widths (channel lengths) of NMOS and PMOS generate deviation. At worst, the deviation of NMOS and PMOS allows the line width of the NMOS to achieve the required dimension, but the gate of PMOS is over-etched or bridging occurs between the two gates.

SUMMARY OF THE INVENTION

Accordingly, the present invention provides a method of fabricating a complementary metal-oxide semiconductor (CMOS). The method can avoid deviation of line widths (channel lengths) of NMOS and PMOS due to the difference of the etching rate caused by concentration distribution of the polysilicon layer. Therefore, over-etching or bridging are further avoided.

To achieve these and other advantages and in accordance with the purpose of the invention, as embodied and broadly described herein, the invention provides a method of fabricating a complementary metal-oxide semiconductor (CMOS). A semiconductor substrate is provided wherein the substrate includes a first region with a first conductive type and a second region with a second conductive type. A conductive layer is formed on the substrate. A patterned insulating layer is formed on the conductive layer. A first photoresist layer is formed over the substrate to cover the first region. A portion of the conductive layer on the second region is removed until the substrate is exposed using the insulating layer as a hard mask. A first doping process is performed on the substrate using the first photoresist layer as a mask. The first photoresist layer is removed. A second photoresist layer is formed to cover the second region. A portion of the conductive layer in the first region is removed until the substrate is exposed using the insulating layer as a hard mask. A second doping process is performed on the substrate using the second photoresist layer as a mask. The second photoresist layer is removed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
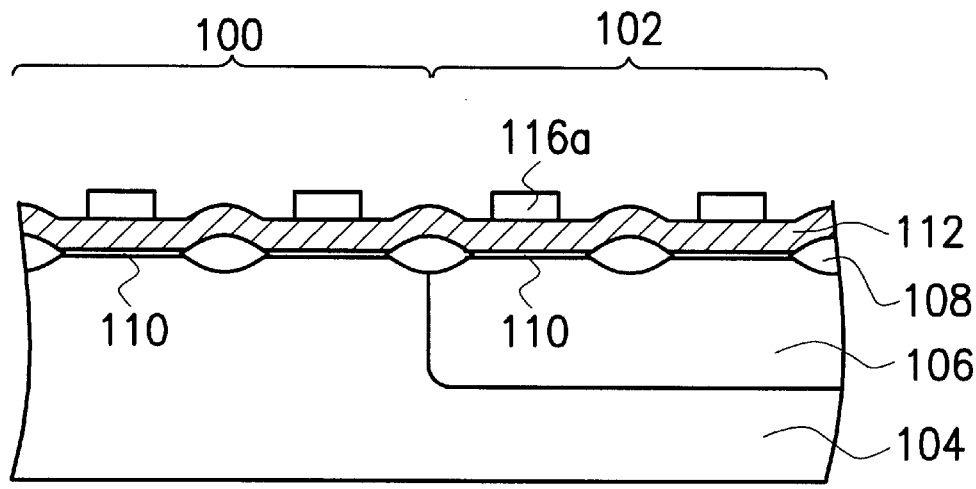
FIG. 1A through FIG. 1E are schematic, cross-sectional views showing a conventional method of fabricating a complementary metal-oxide semiconductor.
Figure 1B:
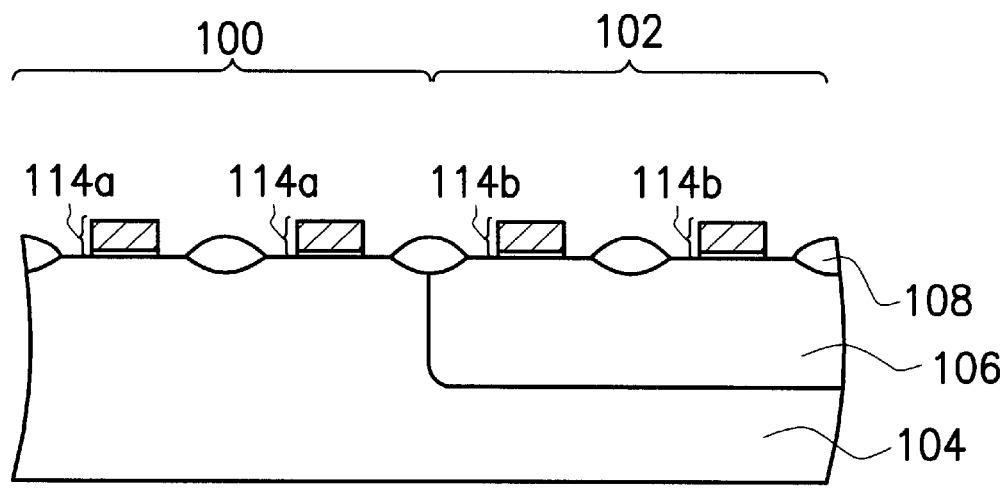
Figure 1C:
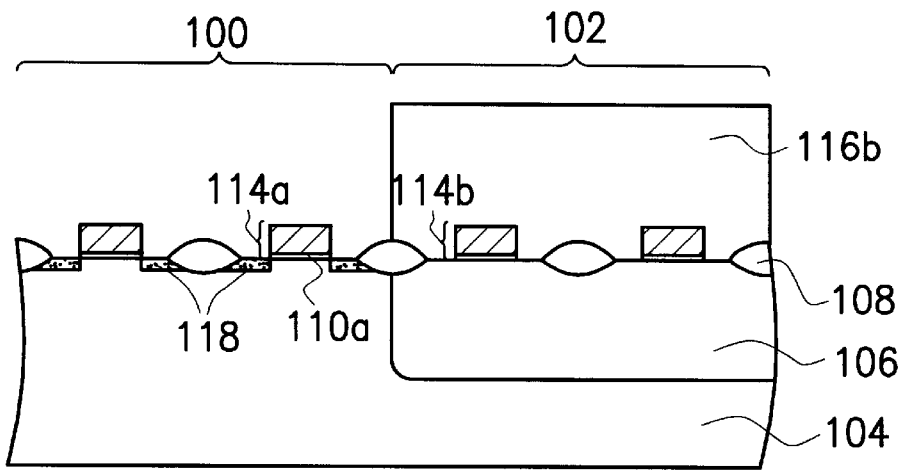
Figure 1D:
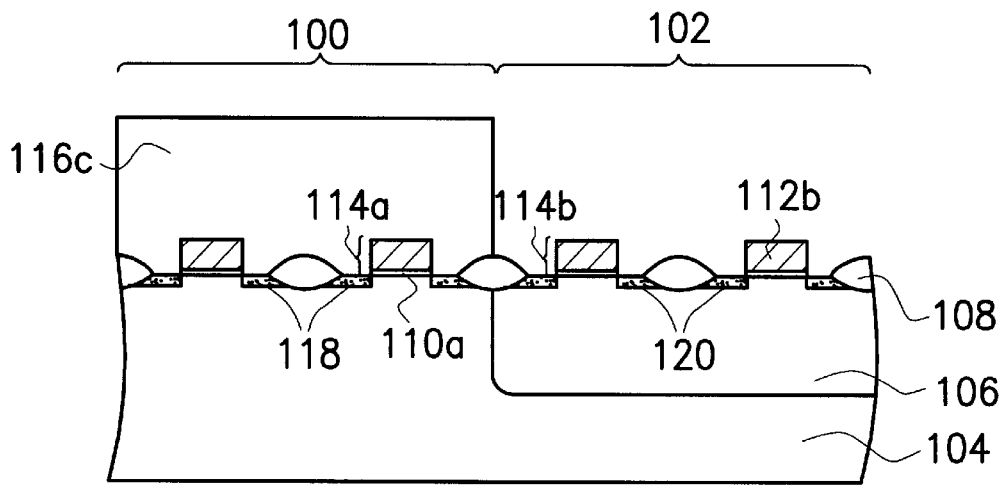
Figure 1E:
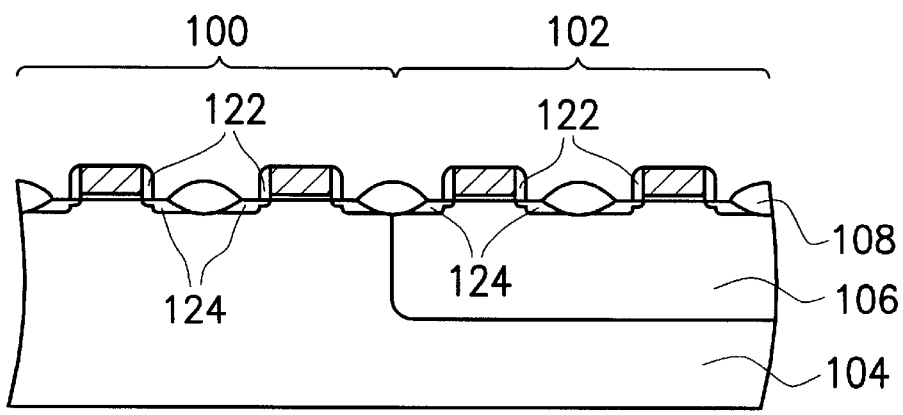

Reference will now be made in detail to the present preferred embodiments of the invention, examples of which are illustrated in the accompanying drawings. Wherever possible, the same reference numbers are used in the drawings and the description to refer to the same or like parts.

FIG. 2A through FIG. 2G are schematic, cross-sectional views showing a method of fabricating a complementary metal-oxide semiconductor according to the preferred embodiment of this invention.

Figure 2A:
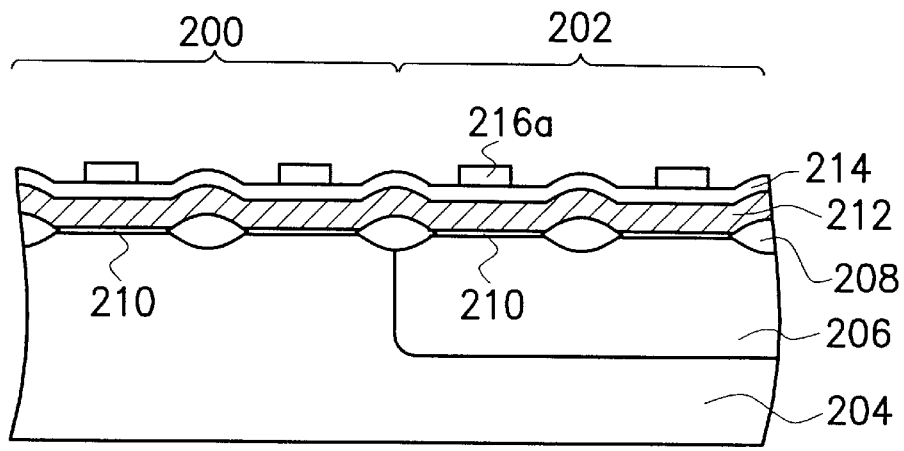
FIG. 2A through FIG. 2G are schematic, cross-sectional views showing a method of fabricating a complementary metal-oxide semiconductor according to one preferred embodiment of this invention.

As shown in FIG. 2A, a semiconductor substrate 204 is provided, wherein a well region with the opposite polarity to the semiconductor 204 is formed. For example, if a P-type semiconductor substrate is provided, then an N-type well is formed therein. In contrast, if an N-type semiconductor substrate is provided, then a P-type well is formed therein. (Can twin-well be used in this invention?) In the embodiment, a P-type semiconductor substrate 204 with an N-type well 206 is provided as an example. In FIGS. 2A to 2G, the part of the wafer indicated by the reference numeral 200 shows the area where an NMOS transistor will be formed, while the other part indicated by the reference numeral 202 shows the area where a PMOS transistor will be formed. A plurality of isolation structures 208 are formed on the substrate 204 in order to define a plurality of active regions. The isolation structures 208 can be formed either through a LOCOS (local oxidation of silicon) process or by first performing an STI (shallow trench isolation) process to form trenches in the substrate 204 and then performing a CVD (chemical-vapor deposition) process to deposit oxide into the trenches.

Still referring to FIG. 2A, a gate oxide layer 210 is formed on the substrate 204, for example, by dry oxidation. A polysilicon layer 212 is formed over the substrate 204, for example, by low-pressure chemical vapor deposition (LPCVD). An insulating layer, such as a silicon nitride layer 214, is formed on the polysilicon layer 212. A photolithography process is performed. Patterned photoresist layers 216a are formed over the substrate 204.

Figure 2B:
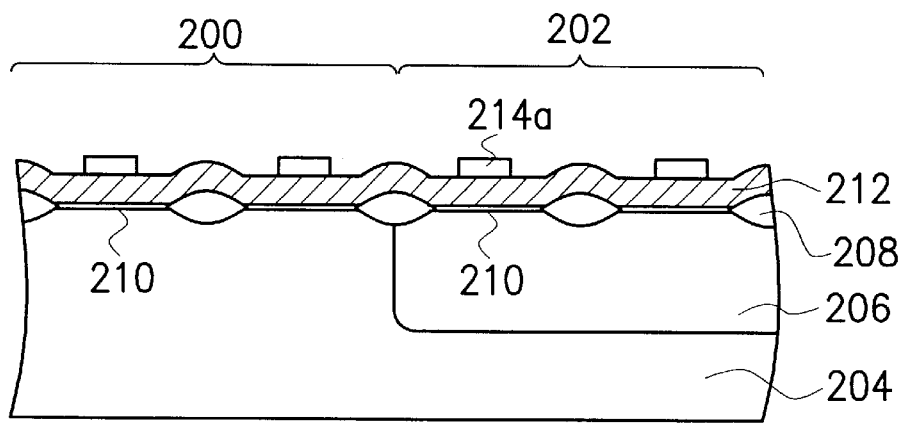

As shown in FIG. 2B, using the photoresist layers 216a as masks, the silicon nitride layer 214 is first etched to form silicon nitride layers 214a on the polysilicon layer 212. The photoresist layers 216a are removed.

Figure 2C:
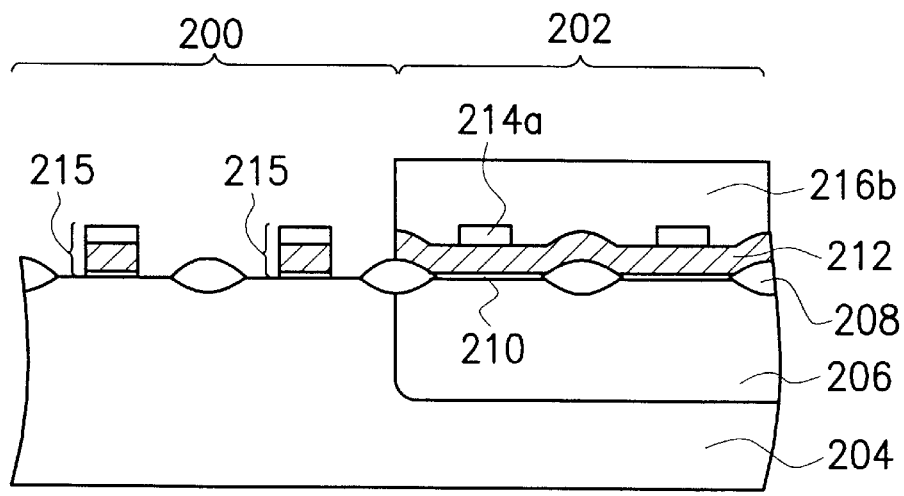

As shown in FIG. 2C, another photoresist layer 216b is formed over the substrate 204 to cover the area 202 where a PMOS will be formed. Using the silicon nitride layers 214a as hard masks, the polysilicon layer 212 and the gate oxide layer 210 are etched to form gates 215 on the area 200 where an NMOS will be formed. An etching solution with a high etching selectivity is chosen to perform this etching process. When using the etching solution with high etching selectivity, only the polysilicon layer 212 is etched without etching the silicon nitride layer 214.

Figure 2D:
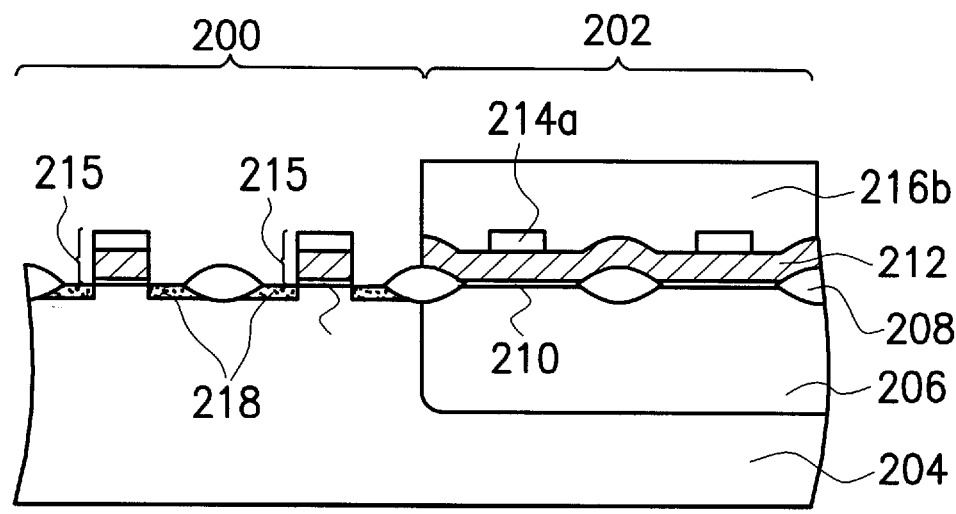

As shown in FIG. 2D, using the photoresist layers 216b as masks, an ion implantation is performed to the substrate 204 to form a lightly doped region 218 beside the gates 215 in the area 200. The photoresist layer 216b is removed.

Figure 2E:
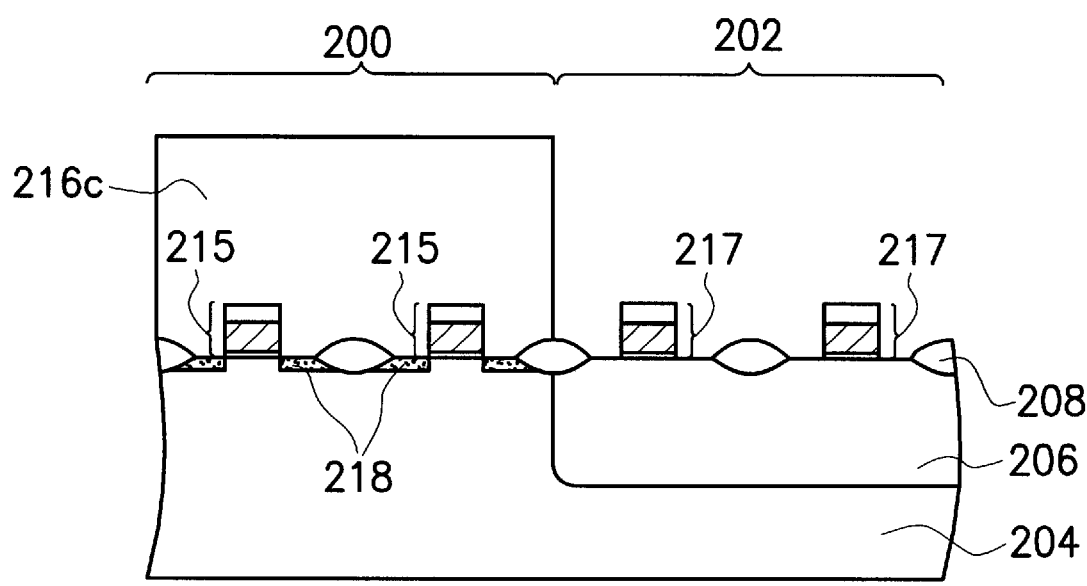

As shown in FIG. 2E, another photoresist 216c is formed over the substrate 204 to cover the area 200 for forming the NMOS. Using the polysilicon nitride layers 214a (FIG. 2D) as hard masks, the polysilicon layer 212 and the gate oxide layer 210 are etched to form gates 217 on the area 202. This etching process also requires an etching solution with high etching selectivity.

Figure 2F:
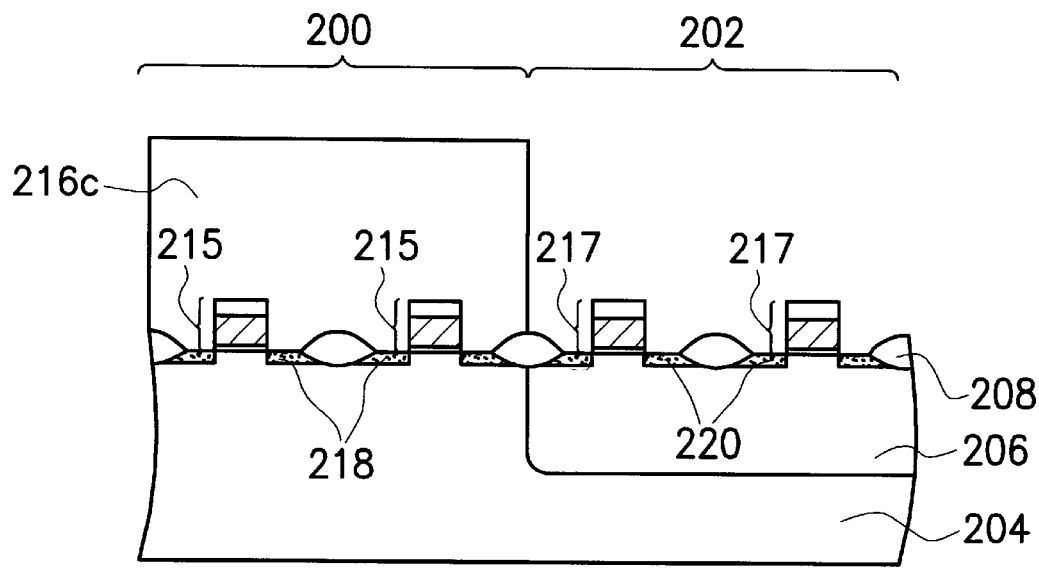

As shown in FIG. 2F, using the photoresist layers 216c as masks, another ion implantation is performed on the substrate 204 to form lightly doped regions 220 beside the gates 217 in the area 202. Then, the photoresist layer 216c is removed.

Figure 2G:
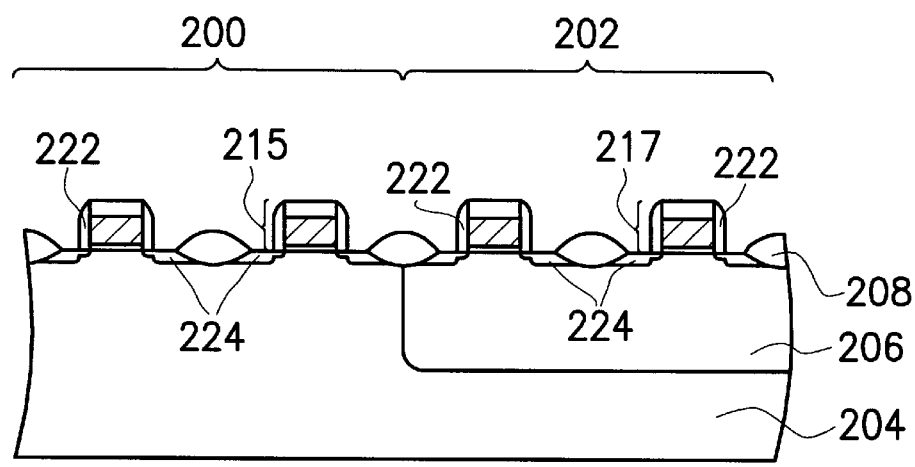

As shown in FIG. 2G, spacers 222 are simultaneously formed on sidewalls of the gates 215 in the area 200 and the gates 217 in the area 202. Using the spacers 222 as masks, heavy ion implantation is respectively performed on the substrate 204 to form a heavily doped region in the area 200 and in the area 202. Source/drain regions 224 having lightly doped drain (LDD) structures are respectively formed in the area 200 and in the area 202. At this stage, a CMOS having an NMOS and a PMOS is completely formed.

In the embodiment, a photoresist is first formed to cover the PMOS. An etching process and an ion implantation are performed on the area whereon the NMOS is formed. Then, another photoresist is formed to cover the NMOS. An etching process and an ion implantation are performed on the area whereon the PMOS is formed. In the invention, the order of the process can be changed. For example, a photoresist can be first formed to cover the NMOS. An etching process and an ion implantation are performed on the PMOS. Then, another photoresist is formed to cover the PMOS. An etching process and an ion implantation are performed on the NMOS.

In the conventional method of fabricating a CMOS, the polysilicon layer is etched to simultaneously form NMOS and PMOS gates, and then ion implantation is respectively performed on the area where a NMOS is formed and the area where a PMOS is formed. Since the dopant concentrations in the polysilicon layer of NMOS and PMOS are different, etching rates for NMOS and PMOS are different so that line widths (channel lengths) of NMOS and PMOS generate deviation. The deviation of NMOS and PMOS allows the NMOS line width to achieve the required dimension, but the gate of PMOS is over-etched or bridging occurs between the two gates. In the invention, an etching process and an ion implantation are performed on the area where one of the PMOS and NMOS is formed, and then another etching process and another ion implantation are performed on the area where the other is formed. The polysilicon layer of NMOS and PMOS is respectively etched without adding to the number of the photoresists. Therefore, the aforementioned over-etching and bridging can be avoided.

Accordingly, features of the invention include:

1. The invention is to respectively etch the polysilicon layer of NMOS and PMOS. Therefore, the difference in the etching rates caused by concentration distribution of the polysilicon layer can be avoided. Thus, over-etching and bridging do not occur.

2. In the invention, while performing the etching processes to form a gate, the silicon nitride layer is used as a hard mask. Since the required number of exposures is the same as the conventional method, the rate of yield is not affected.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a complementary metal-oxide semiconductor, comprising:

providing a substrate, wherein the substrate comprises a first region with a first conductive type and a second region with a second conductive type;

forming a conductive layer on the substrate;

forming a patterned insulating layer on the conductive layer;

forming a first photoresist layer over the substrate to cover the first region;

removing a portion of the conductive layer on the second region until the substrate is exposed using the insulating layer as a hard mask;

performing a first doping process on the substrate using the first photoresist layer as a mask;

removing the first photoresist layer;

forming a second photoresist layer over the substrate to cover the second region;

removing a portion of the conductive layer in the first region until the substrate is exposed using the insulating layer as a hard mask;

performing a second doping process on the substrate using the second photoresist layer as a mask; and removing the second photoresist layer.

2. The method according to claim 1, wherein the conductive layer comprises a polysilicon layer.

3. The method according to claim 2, wherein the polysilicon layer on the first region has the first conductive type and the polysilicon layer on the second region has the second conductive type.

4. The method according to claim 3, wherein the first conductive type is P-type and the second conductive type is N-type.

5. The method according to claim 3, wherein the first conductive type is N-type and the second conductive type is P-type.

6. The method according to claim 1, wherein the insulating layer comprises a silicon nitride layer.

7. The method according to claim 1, wherein the first doping process and the second doping process comprise an ion implantation process.

8. A method of fabricating a complementary metal-oxide semiconductor in a substrate wherein the substrate includes a first region with a first conductive type and a second region with a second conductive type, comprising:

forming a conductive layer on the substrate;

forming a patterned insulating layer on the conductive layer;

selectively removing a portion of the conductive layer on the second region until the substrate is exposed using the insulating layer as a hard mask;

performing a first doping process on the substrate;

selectively removing a portion of the conductive layer on the first region until the substrate is exposed using the insulating layer as a hard mask; and performing a second doping process on the substrate.

9. The method according to claim 8, wherein the conductive layer comprises a polysilicon layer.

10. The method according to claim 9, wherein the polysilicon layer on the first region has the first conductive type and the polysilicon layer on the second region has the second conductive type.

11. The method according to claim 8, wherein the first conductive type is P-type and the second conductive type is N-type.

12. The method according to claim 8, wherein the first conductive type is N-type and the second conductive type is P-type.

13. The method according to claim 8, wherein the insulating layer comprises a silicon nitride layer.

14. The method according to claim 8, wherein the first doping process and the second doping process comprise an ion implantation process.

* * * * *